United States Patent
Mochizuki et al.

(10) Patent No.: US 10,093,075 B2
(45) Date of Patent: Oct. 9, 2018

(54) METHOD FOR MANUFACTURING STRUCTURE AND STRUCTURE

(71) Applicant: ISEL CO., LTD., Osaka (JP)

(72) Inventors: Noboru Mochizuki, Osaka (JP); Tadashi Nishimura, Osaka (JP)

(73) Assignee: ISEL CO., LTD., Osaka (JP)

(*) Notice: Subject to any disclaimer, the term of this patent is extended or adjusted under 35 U.S.C. 154(b) by 224 days.

(21) Appl. No.: 14/979,696

(22) Filed: Dec. 28, 2015

(65) Prior Publication Data
US 2016/0129670 A1  May 12, 2016

Related U.S. Application Data

(63) Continuation-in-part of application No. PCT/JP2015/053781, filed on Feb. 12, 2015.
(Continued)

(30) Foreign Application Priority Data

Feb. 14, 2014 (JP) .................. 2014-026493

(51) Int. Cl.
B32B 7/04 (2006.01)
B23K 20/12 (2006.01)
(Continued)

(52) U.S. Cl.
CPC ............ B32B 7/045 (2013.01); B23K 20/122 (2013.01); B23K 20/129 (2013.01);
(Continued)

(58) Field of Classification Search
CPC .... B23K 20/12; B23K 20/125; B23K 20/127; B23K 26/346; B23K 26/36; B23K 26/38;
(Continued)

(56) References Cited

U.S. PATENT DOCUMENTS 2,469,975 A * 5/1949 McCloy ............... B65B 9/12
219/91.23
5,460,317 A * 10/1995 Thomas ............ B29C 66/1142
228/112.1
(Continued)

FOREIGN PATENT DOCUMENTS

JP H11-300481 A 11/1999
JP 2000-073164 A 3/2000
(Continued)

OTHER PUBLICATIONS

International Search Report issued in International Application No. PCT/JP2015/053781, dated May 19, 2015 and translation thereof (6 pages).
(Continued)

*Primary Examiner* — Jason L Vaughan
(74) *Attorney, Agent, or Firm* — Nakanishi IP Associates, LLC

(57) ABSTRACT

A method for manufacturing a structure in which an edge portion of the structure formed by stacking a plurality of members is friction stir welded. The manufacturing method includes: a welding step of forming a friction stir welded portion by bringing a friction stir welding tool from a side of a surface of a member on one side into contact with a superposition portion of works in which the members are stacked while rotating the friction stir welding tool; and a cutting step of cutting the friction stir welded portion, and in each of two or more works produced by the cutting, a welded portion of the edge portion of the structure is formed with the cut friction stir welded portion.

13 Claims, 18 Drawing Sheets

Related U.S. Application Data

(60) Provisional application No. 62/205,613, filed on Aug. 14, 2015.

(51) Int. Cl.
| | | |
|---|---|---|
| *B32B 1/02* | (2006.01) | |
| *B32B 3/06* | (2006.01) | |
| *B32B 15/01* | (2006.01) | |
| *F28D 9/00* | (2006.01) | |
| *H05K 5/00* | (2006.01) | |
| *H05K 5/03* | (2006.01) | |
| *B23K 28/02* | (2014.01) | |
| *F28F 3/12* | (2006.01) | |
| *F28D 1/03* | (2006.01) | |
| *B32B 15/20* | (2006.01) | |
| *B32B 27/08* | (2006.01) | |
| *B32B 3/14* | (2006.01) | |
| *B32B 3/30* | (2006.01) | |
| *B23K 101/14* | (2006.01) | |
| *F24D 3/16* | (2006.01) | |

(52) U.S. Cl.
CPC .......... *B23K 20/1265* (2013.01); *B23K 28/02* (2013.01); *B32B 1/02* (2013.01); *B32B 3/06* (2013.01); *B32B 3/14* (2013.01); *B32B 3/30* (2013.01); *B32B 15/01* (2013.01); *B32B 15/016* (2013.01); *B32B 15/20* (2013.01); *B32B 27/08* (2013.01); *F28D 1/035* (2013.01); *F28D 9/0031* (2013.01); *F28D 9/0093* (2013.01); *F28F 3/12* (2013.01); *H05K 5/0017* (2013.01); *H05K 5/03* (2013.01); *B23K 2201/14* (2013.01); *B32B 2457/00* (2013.01); *F24D 3/16* (2013.01); *F28F 2275/062* (2013.01)

(58) Field of Classification Search
CPC .......... B23K 28/02; B23K 31/10; B26D 3/18; B26D 3/20; B26D 3/22; B26D 3/225; Y10T 29/49787; Y10T 29/49789; B65B 9/04; B65B 9/045; B65B 9/12; B65B 9/13
USPC ................................ 228/112.1, 2.1, 160, 183
See application file for complete search history.

(56) References Cited

U.S. PATENT DOCUMENTS

| | | | | |
|---|---|---|---|---|
| 5,813,592 | A * | 9/1998 | Midling | B23K 20/122 156/580 |
| 6,242,130 | B1 * | 6/2001 | Noh | H01M 2/021 429/175 |
| 6,601,751 | B2 * | 8/2003 | Iwashita | B23K 20/123 228/112.1 |
| 6,908,690 | B2 * | 6/2005 | Waldron | B23K 20/122 228/112.1 |
| 7,210,213 | B2 * | 5/2007 | Miyamoto | H04R 31/00 228/181 |
| 7,677,299 | B2 * | 3/2010 | Zheng | F28D 15/0233 165/104.26 |
| 8,627,567 | B2 * | 1/2014 | Seo | B23K 20/1265 228/112.1 |
| 8,966,759 | B1 * | 3/2015 | Romero | B23K 20/122 165/104.33 |
| 9,003,649 | B1 * | 4/2015 | Romero | B23K 20/122 29/830 |
| 2006/0016854 | A1 | 1/2006 | Slattery | |
| 2007/0075121 | A1 | 4/2007 | Slattery | |

FOREIGN PATENT DOCUMENTS

| | | |
|---|---|---|
| JP | 2006-289481 A | 10/2006 |
| JP | 2007-307579 A | 11/2007 |
| JP | 2008-207233 A | 9/2008 |
| JP | 2009-195940 A | 9/2009 |
| JP | 2011-079031 A | 4/2011 |

OTHER PUBLICATIONS

Written Opinion of the International Searching Authority issued in International Application No. PCT/JP2015/053781, dated May 19, 2015 (4 pages).

\* cited by examiner

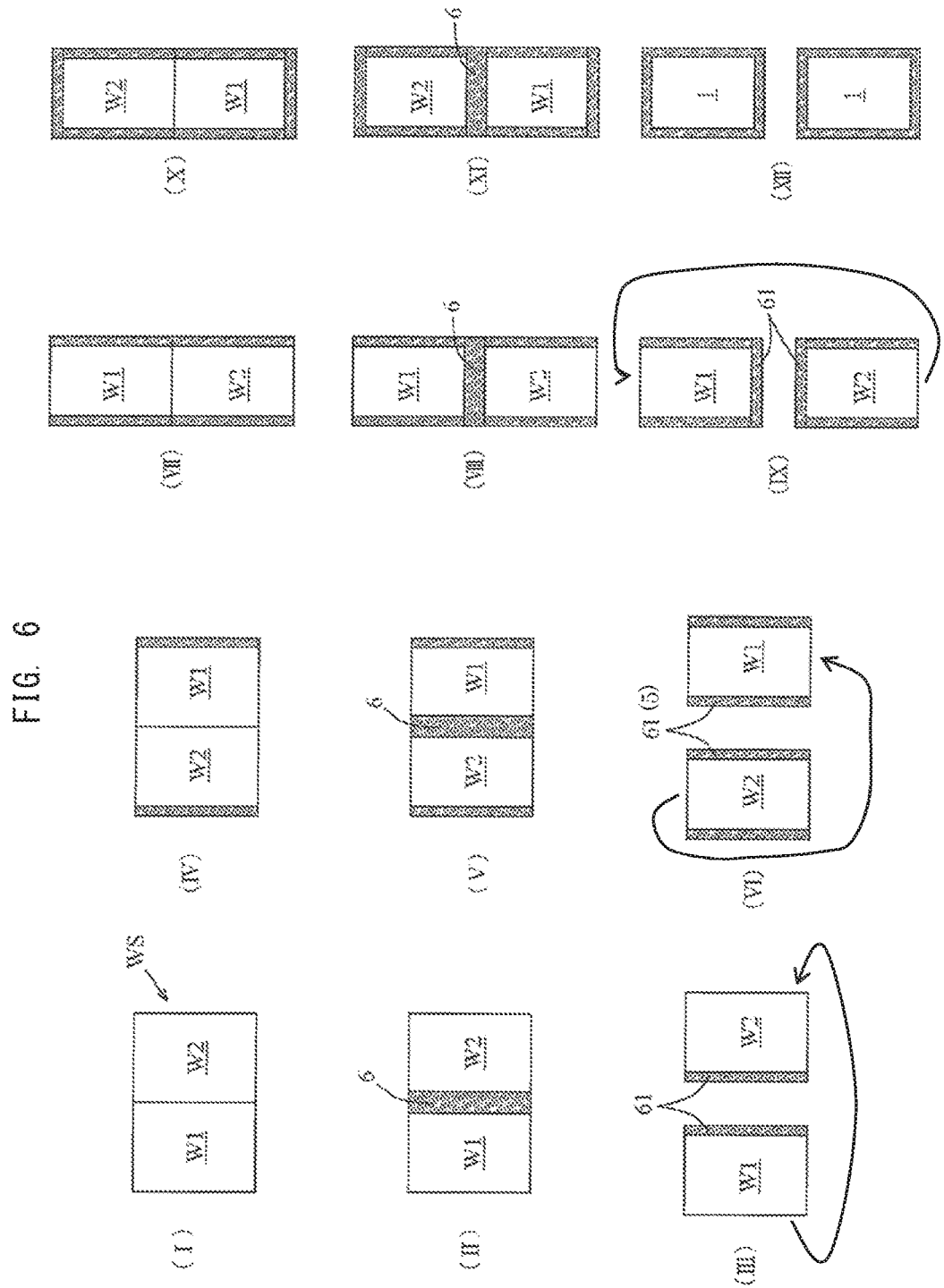

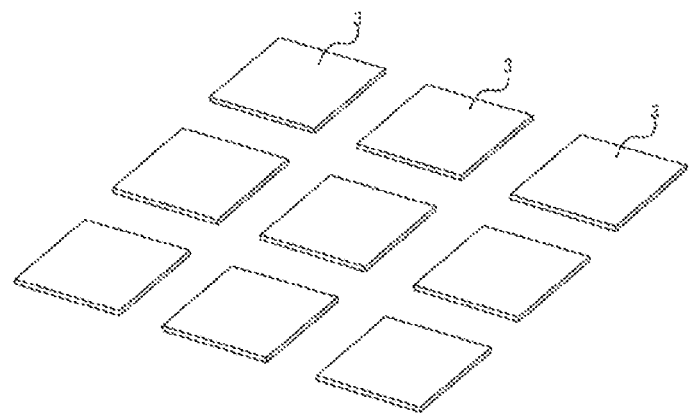
FIG. 14A
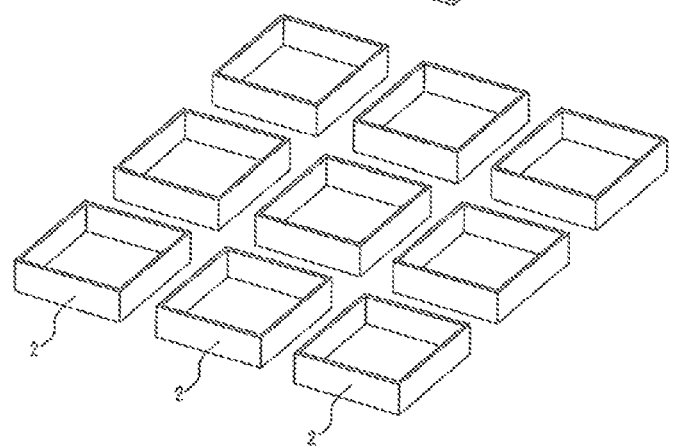
FIG. 14B
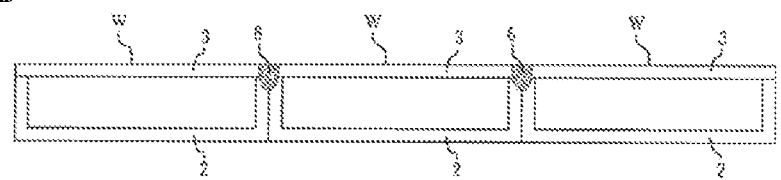

US 10,093,075 B2

METHOD FOR MANUFACTURING STRUCTURE AND STRUCTURE

CROSS-REFERENCE TO RELATED APPLICATION

This application is a continuation-in-part of International Patent Application No. PCT/JP2015/053781 (filed on Feb. 12, 2015), which claims the benefit of priority from Japanese Patent Application No. 2014-026493 (filed on Feb. 14, 2014), and also, this application claims the benefit of priority from U.S. Provisional Patent Application No. 62/205,613 (filed on Aug. 14, 2015), the contents of which are hereby incorporated by reference in their entirety.

BACKGROUND OF THE INVENTION

Field of the Invention

The present invention relates to a method for manufacturing a structure by welding with friction stir welding, and, more particularly, relates to a method for manufacturing a structure by welding an edge portion of the structure formed by stacking a plurality of members with friction stir welding, and to a structure manufactured thereby.

Description of the Related Art

When a plurality of members are stacked and welded, for example, since an aluminum member has a low melting point, it is difficult to apply fusion welding in which a material is melted at high temperature so as to be welded. Hence, in recent years, friction stir welding in which a material is softened without being melted and is welded while being stirred has been widely applied to the welding of a metal having a low melting point metal such as aluminum. In the friction stir welding, a friction stir welding tool is rotated and pressed onto a work in order to supply a necessary amount of heat for the welding. Therefore, a part of a tool tip end surface in the tool called a shoulder is brought into contact with the work during welding, and the contact part of the shoulder and the work after the welding remains having a welding line provided with a width substantially equal to the shoulder diameter. There has been proposed, for example, a cooling plate such as a backing plate for sputtering which is integrally formed by welding with a base portion of a flat-shaped cooling part having therewith a flow path of a coolant.

Although it is preferable to minimize the width of the welding line in the edge portion on the outer circumference of the cooling plate in order to reduce the size of the cooling plate, a width with which the shoulder of the tool makes contact is required in a friction stir welding as described above. Hence, since the edge portion which is friction stir welded on the outer circumference of the cooling plate is equal to or more than the shoulder diameter of the tool, it is difficult to reduce the size of the cooling plate in the production by friction stir welding. In particular, when a plate member on the pressed side of the tool is thick, a tool having a shoulder diameter to perform the friction stir welding and the width of contact by the shoulder of the tool onto the plate member is further increased, with the result that the width of the edge portion of the cooling plate is further increased.

SUMMARY OF THE INVENTION

In view of the foregoing, the present invention provides a method for manufacturing a structure in which the width of a friction stir welding is reduced, and a structure manufactured thereby.

According to one or more embodiments of the present invention, there is provided a method for manufacturing or producing a structure in which an edge portion of the structure formed by stacking a plurality of members is friction stir welded, the manufacturing method including a welding step of forming a friction stir welded portion by bringing a friction stir welding tool from a side of a surface of a member on one side into contact with a superposition portion of works in which the members are stacked while rotating the friction stir welding tool, and a cutting step of cutting the friction stir welded portion, whereby in each of two or more works obtained by the cutting, a junction portion of the edge portion of the structure is formed with the cut friction stir welded portion.

Preferably, the manufacturing method includes an arrangement step of forming abutted portion, before the welding step, by arranging unwelded edge portions of the works in which the members are stacked such that the unwelded edge portions are placed in contact with each other to be flush, and in the welding step, the friction stir welded portion substantially equal to the shoulder diameter is formed by bringing the friction stir welding tool from the side of the surface of the member on one side into contact with the contact portion in the arrangement step while rotating the friction stir welding tool.

According to one or more embodiments of the present invention, there is provided a structure in which an edge portion of the structure formed by stacking a plurality of members is friction stir welded, where the structure has, in apart, parts or a whole of the edge portion of the structure, a cutting surface to which a friction stir welded portion is exposed.

BRIEF DESCRIPTION OF THE DRAWINGS

FIG. 2A is a schematic view showing a plurality of works which are arranged for preparation, FIG. 2B is a schematic view showing how the works are arranged to be flush with each other and friction stir welding is performed, and FIG. 2C is a schematic view showing how a friction stir welded portion is cut.

FIG. 3A is a schematic view showing how the end portions of the respective works are placed in contact with each other. FIG. 3B is a schematic view showing how the friction stir welding is performed, FIG. 3C is a schematic view showing how the friction stir welded portion is cut, and FIG. 3D is a schematic view showing how the friction stir welded portion is halved.

FIG. 6 is a process schematic view showing an example of a manufacturing pattern in two works as a manufacturing pattern example 2.

FIG. 7A is a schematic view showing how the end portions of the respective works are placed in contact with each other, and FIG. 7B is a schematic view showing how the friction stir welding is performed.

FIG. 8A is a schematic view showing how friction stir welding is performed on a work in which three members are stacked. FIG. 8B is a schematic view showing how friction stir welding is performed on a work in which among three members stacked, the member in the middle is a thin plate and has a width narrower than the members on the upper and lower sides. FIG. 8C is a schematic view showing how friction stir welding is performed on a work in which among three members stacked, the e member in the middle is a thin plate and has a size smaller than the members on the upper and lower sides and FIG. 8D is a schematic view showing how friction stir welding is performed on a work in which among three members stacked, the member in the middle is a thin plate and has a size smaller than the members on the upper and lower sides and the members on the upper and lower sides have a protrusion portion at an edge portion.

FIG. 9A is a schematic view showing examples of a cutting position in a cutting step, and FIG. 9B is a schematic view showing differences in the width of the junction portion when cutting is performed in each of the cutting positions.

FIG. 10A is a schematic view showing how a butted portion between works is friction stir welded with a probe-free friction stir welding tool, and FIG. 10B is a schematic view showing how an integral work is friction stir welded with the probe-free friction stir welding tool.

FIG. 12A is a perspective view showing how friction stir spot welding is performed, FIG. 12B is a perspective view showing how a friction stir spot welded portion is cut, and FIG. 12C is a perspective view showing a structure obtained when friction stir spot welding is performed;

FIGS. 14A and 14B show diagrams illustrating a method for manufacturing the structure of the seventh embodiment. FIG. 14A is a schematic view showing a plurality of works which are arranged for preparation, and FIG. 14B is a cross-sectional view showing the works which are friction stir welded.

FIG. 15A is a perspective view of a container, FIG. 15B shows how the end portions of the respective works are placed in contact with each other, and FIG. 15C is a schematic view showing how the friction stir welding is performed.

DETAILED DESCRIPTION

Embodiments of the present invention will be described below reference to the drawings. In embodiments of the invention, numerous specific details are set forth in order to provide a more thorough understanding of the invention. However, it will be apparent to one of ordinary skill in the art that the invention be practiced without these specific details. In other instances, well-known features have not been described in detail to avoid obscuring the invention.

First Embodiment

Figure 1A:
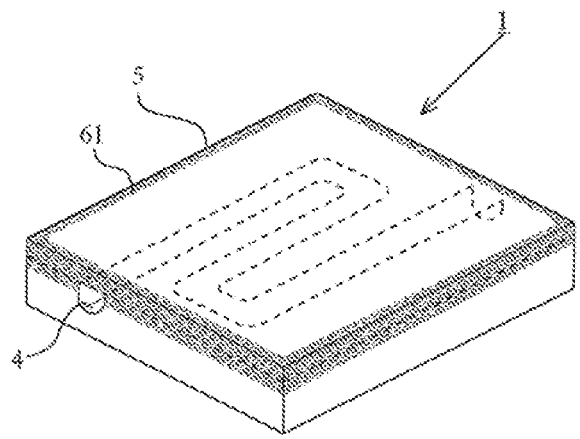
FIG. 1A is a perspective view showing an external configuration of a heat exchanger as a structure manufactured by a method as a first embodiment of the present invention.
Figure 1B:
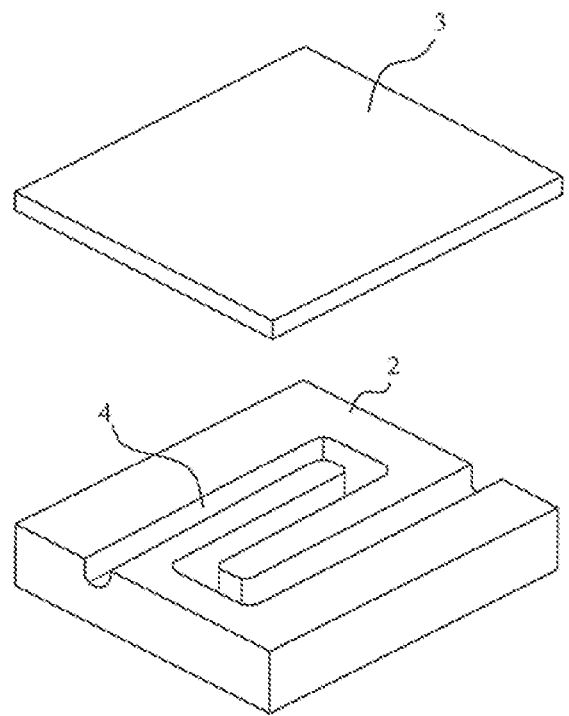
FIG. 1B is an exploded perspective view of the heat exchanger of FIG. 1A before welding in the method.

As a first embodiment of the present invention, FIG. 1A shows an external configuration of a heat exchanger 1 as a structure manufactured by a method of the first embodiment, FIG. 1B shows an exploded perspective view of the heat exchanger of FIG. 1A before welding in the method. Although the heat exchanger will be described as an example of a structure in this first embodiment, the present invention is not limited to the heat exchanger and can be applied to various types of structures such as a display, a hard disk drive, a sensor or other component in which a plurality of members are stacked and an edge portion is welded.

The heat exchanger 1 includes two members 2 and 3 shown in FIG. 1B, that is, substrate 2 (first member which a groove portion 4 serving as the flow path of a cooling medium such as a coolant is thrilled in its surface and lid plate 3 (second member) which is stacked on the surface of the substrate 2, and an edge portion 5 on an outer circumference where the substrate 2 and the lid plate 3 are stacked is friction stir welded into a welded portion 61 shown in FIG. 1A.

The substrate 2 and the lid plate 3 are formed in the shape of a quadrangle having the same size, and the material thereof is aluminum. The material of the substrate 2 and the lid plate 3 is not limited to aluminum, and may be other material such as a metal, a resin or the like that is suitable for friction stir welding. The materials of the substrate 2 and the lid plate 3 may be different from each other, if desired. Although the thickness of the lid plate 3 is smaller than that of the substrate 2, the substrate 2 and the lid plate 3 may be equal in thickness. The groove portion 4 in the surface of the substrate 2 can be formed by mechanical processing such as a ball end mill, and the cross-sectional shape of the groove portion 4 is not limited to the shape of the letter U shown in the figure and may be formed in various shapes such as a square. The planar shape of the groove portion 4 is a winding shape that is extended substantially over the entire surface of the substrate 2, but may be various types of shapes such as branching and combining. In order to enhance corrosion resistance and hardness, surface processing such as plating or coating may be performed on the outer surface of the substrate 2 and the lid plate 3.

Referring to FIGS. 2A-2C and 3A-3D, a method for manufacturing the heat exchanger 1 will be described hereinafter, which includes an arrangement step, a welding step and a cutting step. The substrate 2 includes the groove portion 4 which is formed on its surface.

Figure 2A:
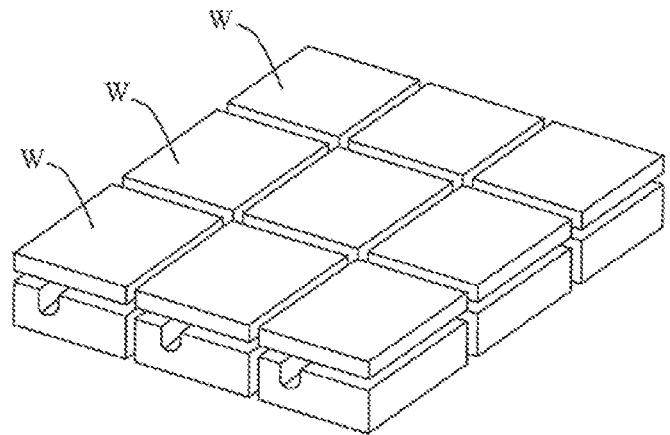
FIGS. 2A-2C show diagrams showing a method for manufacturing the heat exchanger of FIG. 1A.
Figure 2B:
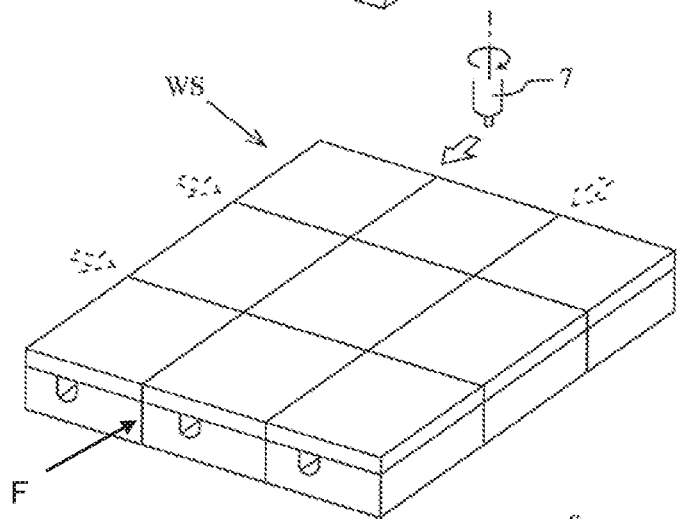
Figure 3A:
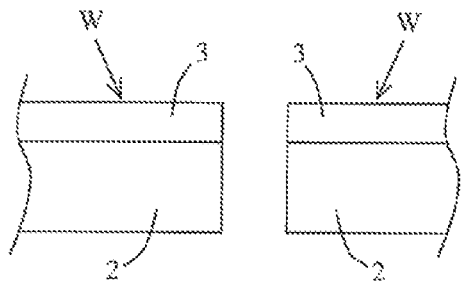
FIGS. 3A-3D show diagrams showing the method for manufacturing the heat exchanger of FIG. 1A.

The arrangement step as a first step is performed by preparing a plurality of works W where the substrate 2 and the lid plate 3 are stacked as shown in FIGS. 2A and 3A, arranging the works W flatly such that the unwelded edge portions 5 having the same lengths are placed in contact with each other to be flush and thereby forming a work set WS where butted portions F are formed as shown in FIG. 2B.

Figure 2C:
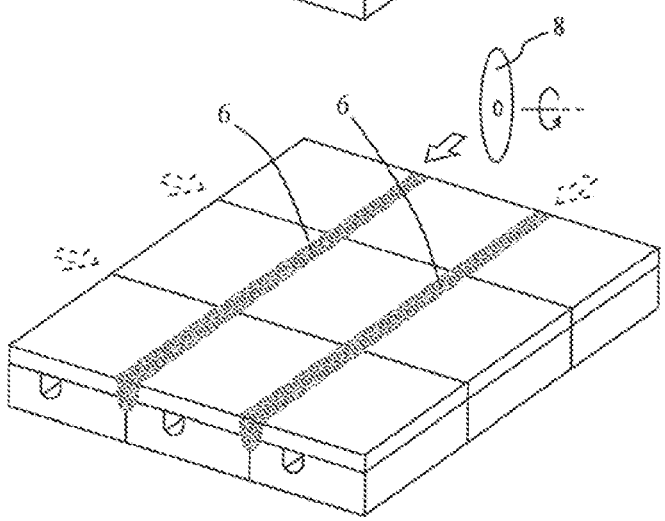
Figure 3B:
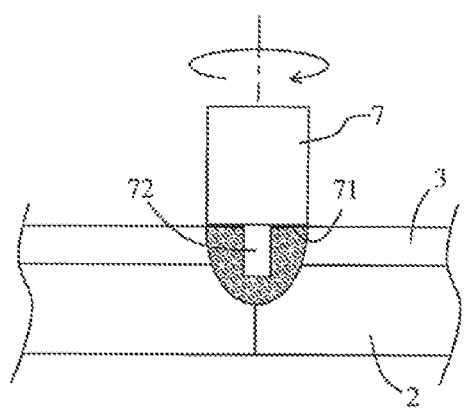

Then, in the welding step, friction stir welding is performed by bringing a friction stir welding tool 7 with rotation from the surface side of the lid plate 3 into contact with a superposition portion where the substrate 2 and the lid plate 3 are stacked in the butted portion F between the works W of the work set WS for a relative movement to form friction stir welded portions 6, whereby a welding line having a width of substantially equal to the shoulder diameter of the friction stir welding tool 7 is formed to remain at the contact portion of the work set WS and the tool 7 as shown in FIGS. 3B, 2B and 2C.

Figure 3C:
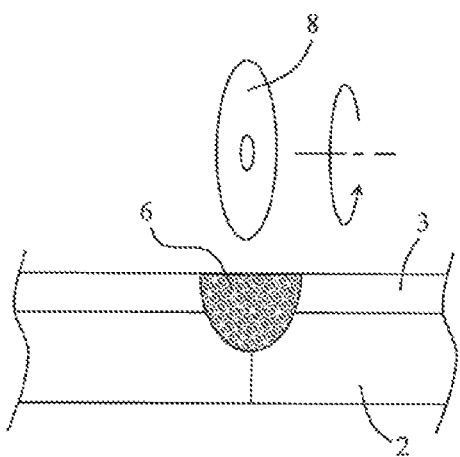
Figure 3D:
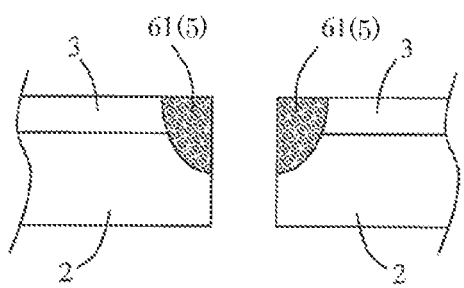

Next, the cutting step is performed by cutting the welded work set WS so as to halve the friction stir welded portions 6 along the direction of the length of the welding line as shown in FIGS. 3C, 3D and 2C, with the result that the junction portions 61 of the edge portions 5 in the heat exchanger 1 are formed with the friction stir welded portions 6 which are cut for each of a plurality of works W obtained by being cut. Then, the arrangement step, the welding step and the cutting step described above are repeatedly performed to weld the edge portions 5 on the entire circumference of the heat exchanger 1, with the result that a plurality of heat exchangers 1 corresponding to the prepared number of works W are produced.

By the manufacturing method described above, thus obtained junction portion 61 of the edge portion 5 of the heat exchanger 1 can be formed so as to have a narrow width which is about half the shoulder diameter of the friction stir welding tool 7. Hence, it is possible to narrow the width of the edge portion 5 of the heat exchanger 1, with the result that the entire size of the heat exchanger 1 can be reduced. Since in the welding step, the edge portions 5 corresponding to at least two heat exchangers 1 can be welded at a time, the welding operation is efficiently performed and labor saving can be achieved. Thus, it is possible to enhance the productivity of the heat exchanger 1 and reduce the production cost.

The friction stir welding tool 7 used in the welding step includes a circular shape shoulder 71 at the tip end of the tool and a probe 72 that protrudes in the center portion of the shoulder 71 as shown in FIG. 3B. The material of the tool 7 is employed to be harder than the substrate 2 and the lid plate 3. For example, an alloy tool steel such as a SKD material and various types such as PCBN are used.

The size of the friction stir welding tool 7 is set at such a size that the friction stir welding can be performed according to the thickness, the material and the like of the lid plate 3 contacted by the tool. For example, when the thickness of the lid plate 3 is 3 to 6 mm, the shoulder 71 whose diameter (shoulder diameter) is about 12 to 36 mm and the probe 72 whose diameter is about 4 to 12 mm are preferably used. The probe 72 is formed to have a length of the equal to or more than the thickness of the lid plate 3 such that the tip end of the probe reaches the substrate 2. For example, though the length is formed to be within a range of the "length equal to the thickness of the lid plate 3" and the "length about 3 mm longer than the thickness of the lid plate 3", but it may be designed to be equal to the thickness of the work W (the total thickness of the substrate 2 and the lid plate 3).

The outer circumferential surface of the probe 72 preferably employs a screw thread, but also a probe without such a screw thread ma be used. As the shape of the surface of the shoulder 71, various shapes of the surface can be used such as a convex surface protruding in a planar shape, an arc-shape or a conical shape, and a concave surface recessed in an arc-shape or a conical shape. The surface of the shoulder 71 can be a smooth surface without a groove or the like, or a surface in which a groove in a spiral shape or the like is formed.

As welding conditions, the rotation speed and the welding speed of the friction stir welding tool 7 are set at proper values such that sufficient welding strength can be obtained by the conditions of the material of the substrate 2 and the lid plate 3, the thickness of the lid plate 3 on the pressed side and the like. For example, when the substrate 2 and the lid plate 3 are formed of aluminum, and the thickness of the lid plate 3 is 3 to 6 mm, the rotation speed of the friction stir welding tool 7 can be set at 400 to 1800 revolutions/minute, and the welding speed can be set at 100 to 600 mm/minute.

Although cutting can be performed with a blade 8 such as a rotary blade (see FIGS. 2C and 3C) as a cutting method in the cutting step, without limitation thereto, the method may be performed with any other cutting means such as a laser.

Examples of the manufacturing pattern of the present manufacturing method will be described hereinafter.

Manufacturing Pattern Example 1

As a manufacturing pattern example 1, an example of the manufacturing pattern in nine works W will be described first.

Figure 4:
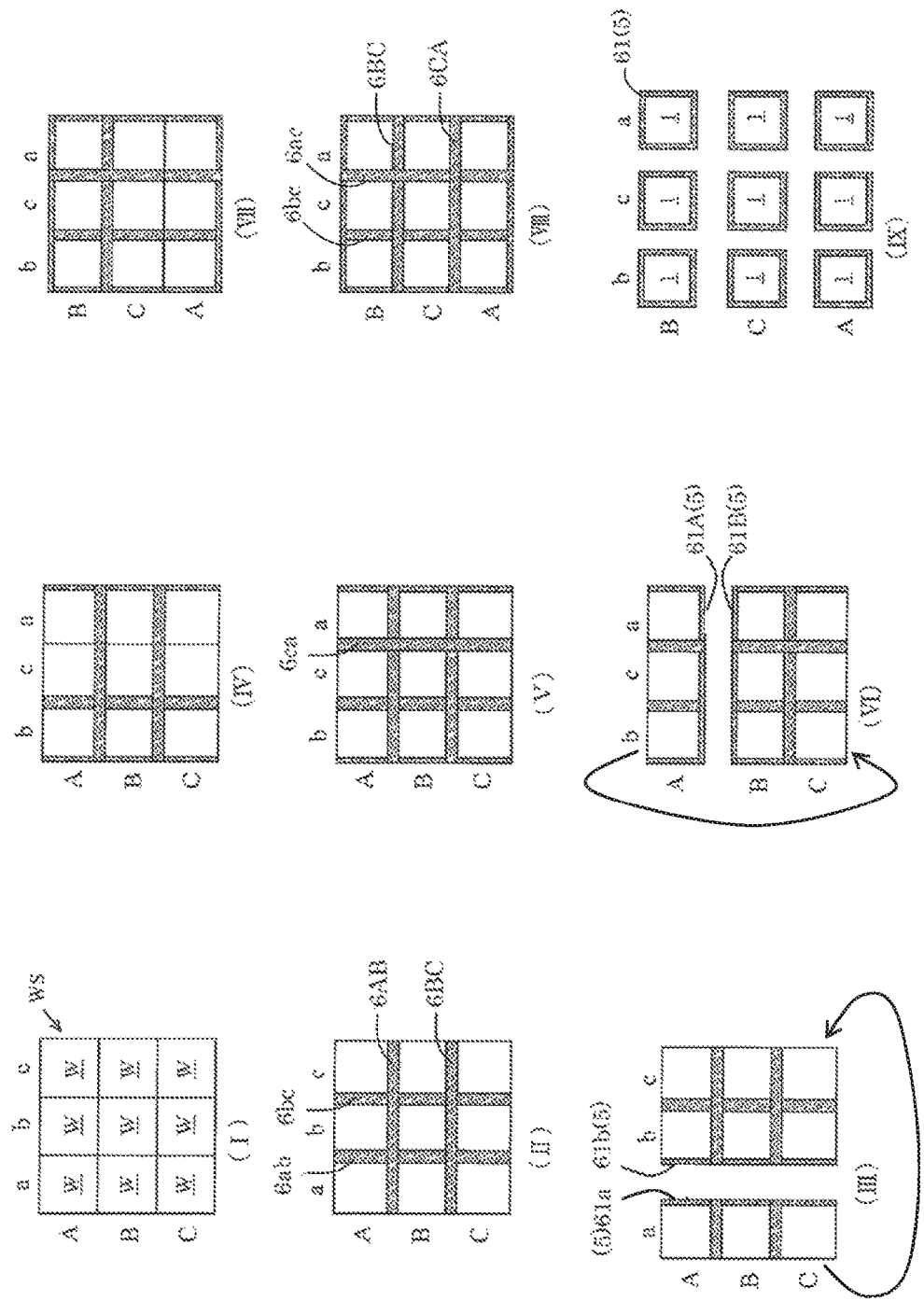
FIG. 4 is a process schematic view showing an example of a manufacturing pattern in nine works as a manufacturing pattern example 1.

Referring to FIG. 4, nine works W where the substrate 2 and the lid plate 3 are stacked are prepared, and these works W are arranged flatly in 3 rows×3 columns such that the edge portions 5 are placed in contact with each other to be flush and are thereby formed into the work set WS (arrangement (I) of FIG. 4). In the work set WS, friction stir welding is performed with the friction stir welding tool 7 on a superposition portion where the substrate 2 and the lid plate 3 are stacked in each of two linear butted portions of the works W in a longitudinal direction between a column "a" and a column "h" and between a column "b" and a column "c". Then, friction stir welding is performed with the friction stir welding tool 7 on a superposition portion where the substrate 2 and the lid plate 3 are stacked in each of two linear butted portions of the works W in a lateral direction between a row "A" and a row "B" and between a row "B" and a row "C" (arrangement (II) of FIG. 4). Thus, two pairs of friction stir welded portions "6ab and 6bc" and "6AB and 6BC" having the width of the welding line substantially equal to the shoulder diameter of the friction stir welding tool 7 are formed in the respective longitudinal and lateral directions.

Then, after the friction stir welding, the work set WS is cut with the blade 8 as shown in FIG. 2C such that one of the pair of the friction stir welded portions 6ab and 6bc in the longitudinal direction, for example, the friction stir welded portion 6ab between the column "a" and the column "b" is halved along the direction of the length of the welding line with respect to a substantially center portion of the welding line (arrangement (III) of FIG. 4). Then, in the respective works W of the column "a" and the column "b", the junction portions 61a and 61b are formed each of which has a width about half of the line width of the friction stir welded portion 6*ab* in the edge portion 5 on one end side, that is, a narrow width about half of the shoulder diameter of the friction stir welding tool 7.

Then, the works W of the column "a" are moved as shown by an arrow mark in the arrangement (M) of FIG. 4, and the unwelded edge portions 5 of the respective works W of the column "a" and the column "c" are arranged flatly such that the edge portions 5 are placed in contact with each other to be flush (arrangement (IV) of FIG. 4). Then, friction stir welding is performed with the friction stir welding tool 7 on a superposition portion where the substrate 2 and the lid plate 3 are stacked in the linear butted portion of the work W between the columns "a" and "c" to form a friction stir welded portion 6*ca* having the width of the welding line substantially equal to the shoulder diameter of the friction stir welding tool 7 (arrangement (V) of FIG. 4). Further, the work set WS is cut with the blade 8 such that one of the two friction stir welded portions 6AB and 6BC in the lateral direction previously friction stir welded (arrangement (II) of FIG. 4), for example, the friction stir welded portion 6AB between the row "A" and the row "B" is halved along the direction of the length of the welding line with respect to a substantially center portion of the welding line (arrangement (VI) of FIG. 4). Thus, in the respective works of the rows A and B, there are formed friction stir welded portions 61A and 61B each having the width about half of the line width of the friction stir welded portion 6AB in the edge portion 5 on one end side.

Then, the respective works W of the row "A" are moved in the arrangement (VI) of FIG. 4, and the unwelded edge portions 5 of the respective works W of the rows "A" and "C" are arranged flatly such that the edge portions 5 are placed in contact with each other to be flush (arrangement (VII) of FIG. 4). Then, friction stir welding is performed with the friction stir welding tool 7 on a superposition portion where the substrate 2 and the lid plate 3 are stacked in the linear butted portion of the work W between the rows "A" and "C" to form a friction stir welded portion 6CA having the width of the welding line substantially equal to the shoulder diameter of the friction stir welding tool 7 (arrangement (VIII) of FIG. 4).

Then, the work set WS is cut with the blade 8 such that the two friction stir welded portions 6*ac* and 6*bc* in the longitudinal direction between the column "a" and the column "c" and between the column "b" and the column "c" and the two friction stir welded portions 6BC and 6CA in the lateral direction between the row "B" and the row "C" and between the row "C" and the row "A" are halved along the direction of the length of the welding line with respect to a substantially center portion of the welding line (arrangement (IX) of FIG. 4). Thus, according to the manufacturing process described above, nine heat exchangers 1 are made in which the junction portions 61 each having a narrow width about half the shoulder diameter of the friction stir welding tool 7 are formed in the edge portions 5 on the entire circumference.

Figure 5:
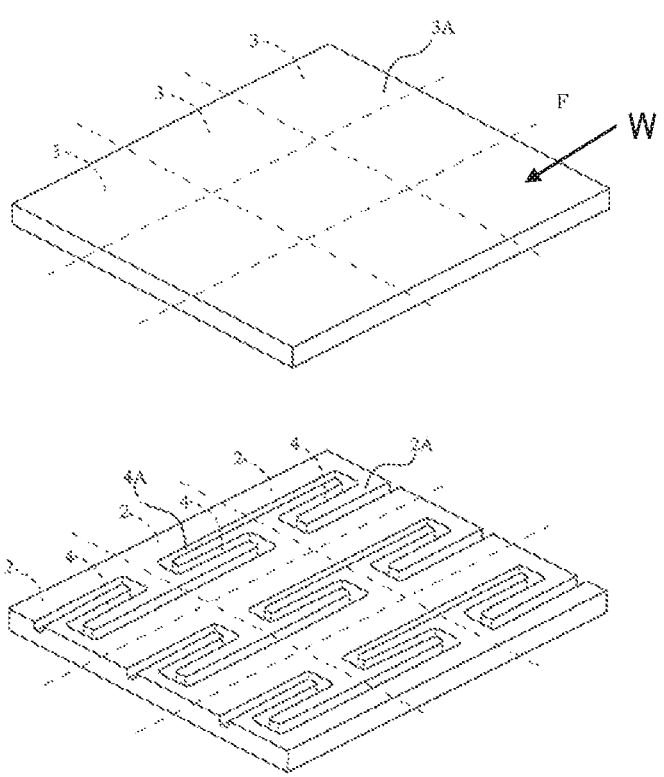
FIG. 5 is a perspective view showing an integral substrate and an integral lid plate from which a plurality of structure are manufactured as a work used by a method in which an arrangement step is not required at first.

A plurality of works W each of which corresponds to one heat exchanger 1 are prepared as the work set at the beginning of the arrangement process of the manufacturing process, but, if desired, e.g., a single work W from which a plurality of heat exchangers 1 can be produced may be employed as shown in FIG. 5.

As indicated in FIG. 5 by division with dotted lines, for example, at first as an arrangement step, a substrate group 2A in which the substrates 2 corresponding to the nine works W are formed integrally and a lid plate group 3A in which the lid plates 3 corresponding to the nine works W are formed integrally are stacked as a stacked work set (WSA). Then, portions where the substrate 2 and the lid plate 3 are stacked is friction stir welded and cut along the boundary lines (the dotted lines in FIG. 5) corresponding to butted portions F of works W in the respective columns and rows of the work set (WSA) in the same manner as shown by the arrangements (II) and (III) of FIG. 4. Further, the processes of arrangement, welding, and cutting are repeated as shown in the arrangements (IV) to (IX) of FIG. 4. Thus, nine heat exchangers 1 are also manufactured in which the junction portions 61 having a narrow width about half the shoulder diameter of the friction stir welding tool 7 are formed in the edge portions 5 on the entire circumference.

In a groove portion formation step, the groove portions 4A of the substrate 2A are formed by continuously connecting the groove portions 4 of the works W aligned in the direction of the row or the column. In this way, it is possible to form the groove portions 4 of the works W at a time and to efficiently perform processing on the groove portion as compared with the case where the processing on the groove portion is performed for each of the substrates 2 of the works W.

Nine (three columns×three columns) heat exchangers 1 in total are made in the above mentioned manufacturing pattern 1, but, if desired, a predetermined number of heat exchangers may be made by increasing the numbers of the rows and columns.

Manufacturing Pattern Example 2

As a manufacturing pattern example 2, an example of the manufacturing pattern in 2 works W (the minimum number) will be described hereinafter.

Referring to FIG. 6, two works W where substrates 2 and lid plates 3 are stacked are prepared, and these works W are arranged flatly such that the edge portions 5 are placed in contact with each other to be flush and are thereby formed into the work set WS (arrangement (I) of FIG. 6). On a superposition portion where the substrates 2 and the lid plates 3 are stacked each other in the work butted portion between the work W1 and the work W2, friction stir welding is performed with the friction stir welding tool 7 (arrangement (II) of FIG. 6). Then, a friction stir welded portion 6 having the width of the welding line substantially equal to the shoulder diameter of the friction stir welding tool 7 is formed in the longitudinal direction between the work W1 and the work W2.

After the friction stir welding, the welded work set WS is cut such that the friction stir welded portion 6 in the longitudinal direction between the work W1 and the work W2 is halved along the direction of the length of the welding line with respect to a substantially center portion of the welding line (arrangement (III) of FIG. 6). Then, between the work W1 and the work W2, the junction portion 61 is formed that has a width about half of the line width of the friction stir welded portion 6 in the edge portion 5 on one end side, that is, a narrow width about half of the shoulder diameter of the friction stir welding tool 7.

The work W1 and the work W2 are rearranged in the lateral direction, the unwelded edge portions 5 are arranged flatly such that the edge portions 5 are placed in contact with each other to be flush (arrangement (IV) of FIG. 6), and the superposition portion where the substrate 2 and the lid plate 3 are stacked in the other butted portion in the longitudinal direction of the work W is friction stir welded with the friction stir welding tool 7 (friction stir welded portion 6 in an arrangement (V) of FIG. 6). After the friction stir welding, the welded work set WS is cut such that the other friction stir welded portion 6 in the longitudinal direction between the work W1 and the work W2 is halved along the direction of the length of the welding line with respect to a substantially center portion of the welding line to form a welded portion 61 (arrangement (VI) of FIG. 6).

Next, the work W1 and the work W2 are arranged in the longitudinal direction, the unwelded edge portions 5 are arranged flatly such that the edge portions 5 are placed in contact with each other to be flush (arrangement (VII) of FIG. 6) and the superposition portion where the substrate 2 and the lid plate 3 are stacked in the work W butted portion in the lateral direction is friction stir welded with the friction stir welding tool 7 (friction stir welded portion 6 in an arrangement (VIII) of FIG. 6). After the friction stir welding, the welded work set WS is cut such that the friction stir welded portion 6 in the lateral direction between the work W1 and the work W2 is halved along the direction of the length of the welding line with respect to a substantially center portion of the welding line (arrangement (IX) of FIG. 6).

Next, the work W1 and the work W2 are rearranged in the longitudinal direction, the unwelded edge portions 5 are arranged flatly such that the edge portions 5 are placed in contact with each other to be flush (arrangement (X) of FIG. 6) and the superposition portion where the substrate 2 and the lid plate 3 are stacked in the other butted portion in the lateral direction of the work W is friction stir welded with the friction stir welding tool 7 (arrangement (XI) of FIG. 6). After the friction stir welding, the welded work set WS is cut such that the other friction stir welded portion 6 in the lateral direction between the work W1 and the work W2 is halved along the direction of the length of the welding line with respect to a substantially center portion of the welding line (arrangement (XII) of FIG. 6). Thus, in the manufacturing process described above, a pair of heat exchangers 1 are manufactured in which the junction portions 61 having a narrow width about half the shoulder diameter of the friction stir welding tool 7 are formed in the edge portions 5 on the entire circumference.

In the present invention, as in the embodiment described above, it is not always necessary to weld all of the sides of the work W, and an arbitrary side thereof may be welded according to the application and purpose of a work or a structure to be welded.

Second Embodiment

Figure 7A:
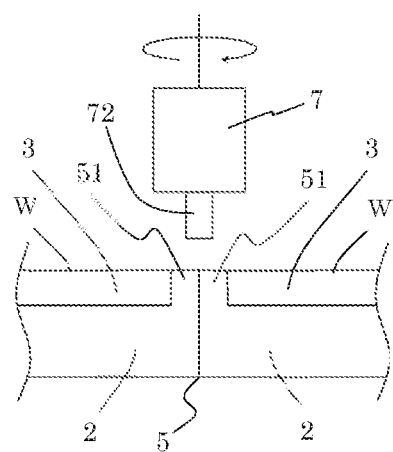
FIGS. 7A and 7B show diagrams for illustrating a method of a second embodiment of the present invention.
Figure 7B:
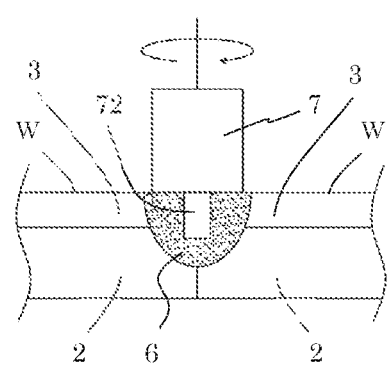

Referring to FIGS. 7A and 7B, there is shown a manufacturing method as a second embodiment according to the present invention. Substrates 2 and lid plates 3 are not limited to the same in size, and the substrates 2 may be larger than the lid plates 3 in size. For example, as shown in FIG. 7A, the substrates 2 each is provided with a salient portion 51, and each lid plate 3 may be smaller than each substrate 2 with respect to the size corresponding to the salient portion 51. Since the lid plate 3 is inserted inside of the salient portion 51 of the substrate 2, the positioning of the lid plate 3 to the substrate 2 becomes easy. Thus, unwelded edge portions 5 of the respective works W are placed in contact with each other to be flush, and the superposition portion where the substrate 2 and the lid plate 3 are stacked is friction stir welded with a friction stir welding tool 7 provided with a shoulder having a diameter substantially equal to or larger than the widths of the pair of salient portions 51 as shown in FIG. 7B, whereby a friction stir welded portion 6 is formed on the substrate 2 and the lid plate 3 of each work W. Then, the processes of cutting, arrangement and welding are properly repeated, and a desired plurality of structures may be manufactured.

Third Embodiment

Figure 8A:
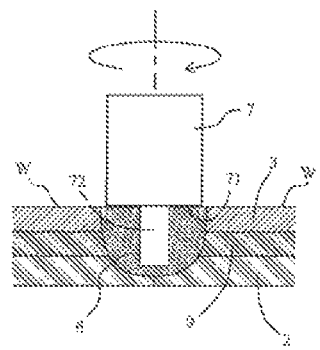
FIGS. 8A-8D show diagrams for illustrating a method of third embodiment.

Referring to FIGS. 8A to 8D, there is shown a manufacturing method as a third embodiment according to the present invention. In this manufacturing method, the number of members stacked can be plural so as to be two or more. For example, as shown in FIG. 8A, the work W in which three members 2, 3 and 9 are stacked can be friction stir welded. In this case, as a friction stir welding tool, for example, a friction stir welding tool 7 may include a probe 72 of which the probe length is equal to or more than a thickness obtained by subtracting the thickness of the member 2 arranged on an end surface (the opposite side to the tool-pressed side) on one side from the thickness of all the members 2, 3 and 9 stacked in layers but equal to or less than the thickness of the members 2, 3 and 9 stacked in layers.

Figure 8B:
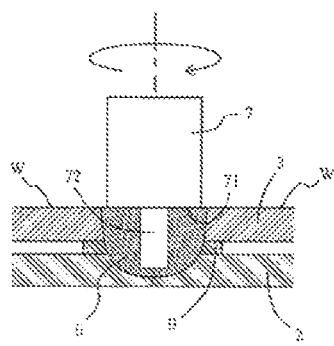

The members may be formed with a combination in which one or all of the members differ in thickness such as in a case where a thin plate is used in one or all of the members. For example, as shown in FIG. 8(B), m the work W where the three members 2, 3 and 9 are stacked, as the member 9 in the middle, a thin plate can be used or as the two members on the upper and lower sides, thin plates can also be used.

The members may be formed with a combination in which one or all of the members differ in size. For example, as show FIG. 8B, in the work W where the three members 2, 3 and 9 are stacked, the member 9 in the middle can have a narrower width than the other members 2 and 3.

Figure 8C:
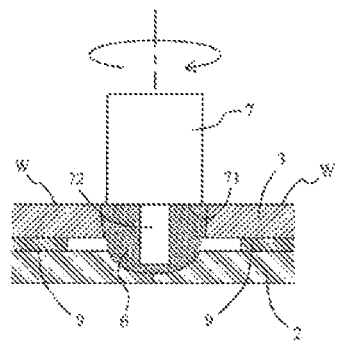

As shown in FIG. 8C, the member 9 in the middle can have such a size that the member 9 is smaller than the other members 2 and 3 and that the member 9 is not in contact with the probe 72. In this case, the members 2 and 3 on the upper and lower sides are friction stir welded with the friction stir welding tool 7 through a gap corresponding to the thickness of the member 9 in the middle.

Figure 8D:
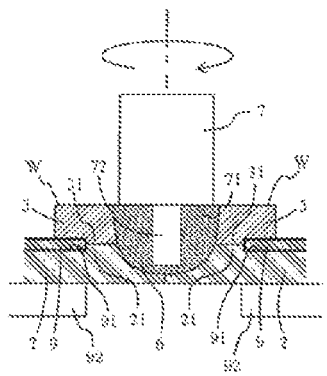

As shown in FIG. 8D, the members 2 and 3 on the upper and lower sides may have protrusion portions 21 and 31, and the width of a gap portion 91 in the thickness direction formed in the protrusion portions 21 and 31 when the protrusion portions 21 and 31 are brought into contact with each other by stacking the members 2 and 3 on the upper and lower sides may be substantially equal to the thickness of the member 9 in the middle. In this case, the member 9 in the middle is arranged in the gap portion 91 such that the member 9 can be sandwiched between the members 2 and 3 on the upper and lower sides.

Moreover, when the member 9 in the middle is formed of a material, e.g. such as a semiconductor film having low heat resistance, a cooling device 92 such as a heat exchanger or the like is attached to the member 2 on one side so as to reduce thermal effects, and thus it is possible to protect the member 9 in the middle.

All the members may have the same material or the members may be a combination in which one or all of the members differ in material. For example, all the members can be formed of the same material such as a metal or the members can be a combination in which one or all of the members differ in material (different materials) such as a combination of a member made of metal and a member made of resin. Even when all the members are formed of the same material, the members may be a combination in which one or all of the members differ in the characteristics of the material.

For example, the members can be a combination of different kind of materials by the same material, such as a combination of different kind metals like a combination of a member made of aluminum and a member made of iron or a combination of different kind resin. Even when all the members are formed of the same material, the members may be a combination in which one or all of the members differ in the characteristics. For example, even when all the members are formed of aluminum, the members can be a combination in which one or all of the members differ in the model number of aluminum.

Fourth Embodiment

Figure 9A:
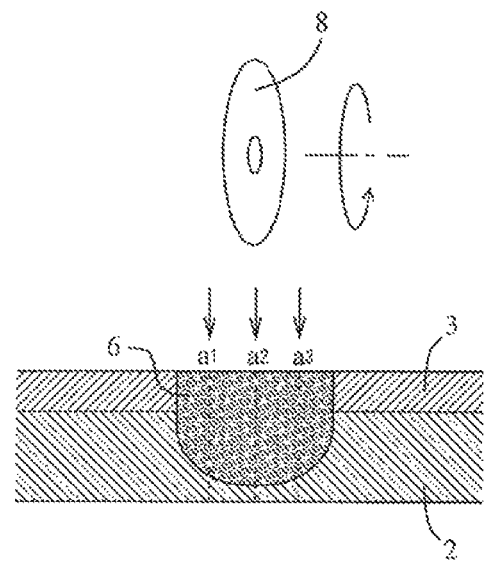
FIGS. 9A-9B show diagrams for illustrating a method of a fourth embodiment of the present invention.
Figure 9B:
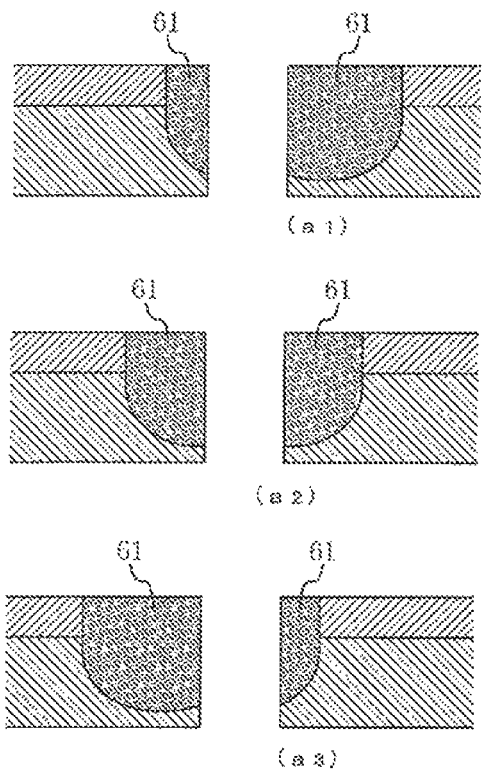

Referring to FIGS. 9A and 9B, there is shown a manufacturing method as a fourth embodiment according to the present invention. In this manufacturing method, a cutting position in the cutting step can be set at an arbitrary position of the friction stir welded portion. In FIG. 2, in the friction stir welded portion welded in the welding step on the butted portion between the works formed in the arrangement step, the whole or a substantially whole close to the back surface of the butted portion between the works is friction stir welded, so that not only the butting position of the butted portion can be set at the cutting position but also an arbitrary position displaced from the butting position can be set at the cutting position. Naturally, as shown in FIG. 5, in the integral member (without the butted portion) where a plurality of works are manufactured without the arrangement step being performed, an arbitrary position of the friction stir welded portion can be set at the cutting position.

For example, as shown in FIG. 9A, the cutting position can be set at any one of a leftward position a1, a center position a2 and a rightward position a3 of the friction stir welded portion 6. In this way, for example, as shown in FIG. 9B, the width of the junction portion 61 of the edge portion of the structure can be adjusted according to the cutting positions (a1) to (a3) corresponding to the positions a1 to a3 of FIG. 9A as necessary.

Fifth Embodiment

Figure 10A:
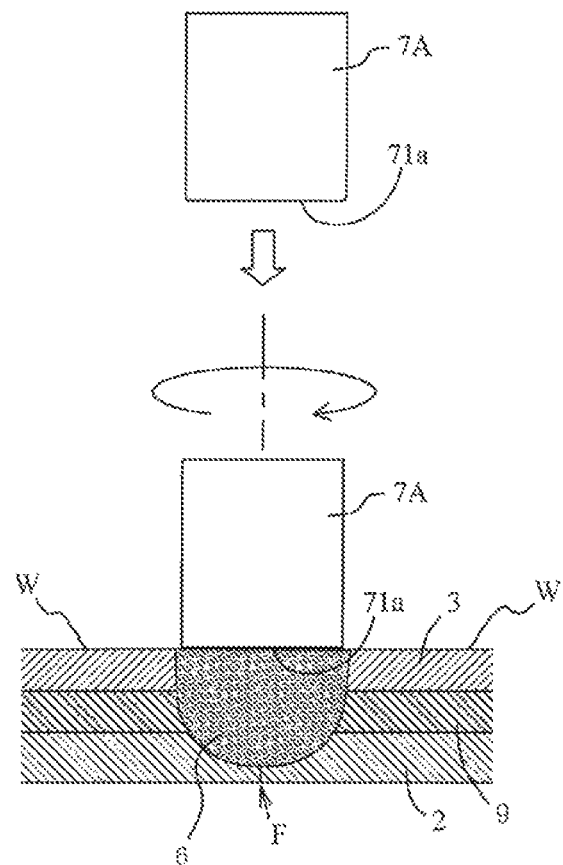
FIGS. 10A and 10B show diagrams for illustrating a method of a fifth embodiment of the present invention.
Figure 10B:
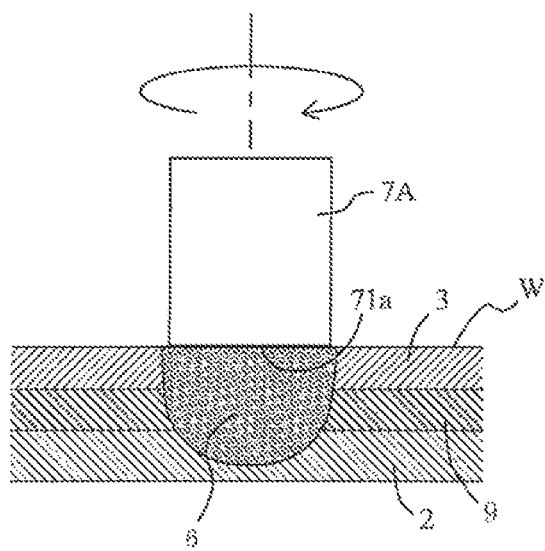

Referring to FIGS. 10A and 10B, there is shown a manufacturing method as a fifth embodiment according to the present invention. In this manufacturing method, as the friction stir welding tool used in the welding step, various types of tools can be used. For example, the friction stir welding tool is not limited to the probe-equipped tool in which the probe is placed on the shoulder at the tip end of the tool, and as shown in FIGS. 10A and 10B, a probe-free tool 7A in which no probe is placed on the shoulder 71a may be used. As long as the probe-free tool 7A is a tool capable of performing friction stir welding on the members 2, 3 and 9, for example, various types of tools can be used such as a tool in which the shoulder surface is smooth and a tool in which a groove is provided in the shoulder surface.

Even when the probe-free tool 7A is used, the probe-free tool 7A is used not only in a case where as shown in FIG. 10A, the butted portion F between two works W is friction stir welded in the arrangement step but also in a case where as shown in FIG. 10B, the work W of the integral member (without the butted portion) where a plurality of structures are produced is friction stir welded without the arrangement step being performed. Even when the probe-free tool 7A is used, without limitation to the case where the work W in which the three members 2, 3 and 9 are stacked is friction stir welded as shown in FIGS. 10A and 10B, a work in which a plurality of members that are two or more members are stacked can be friction stir welded.

Figure 11:
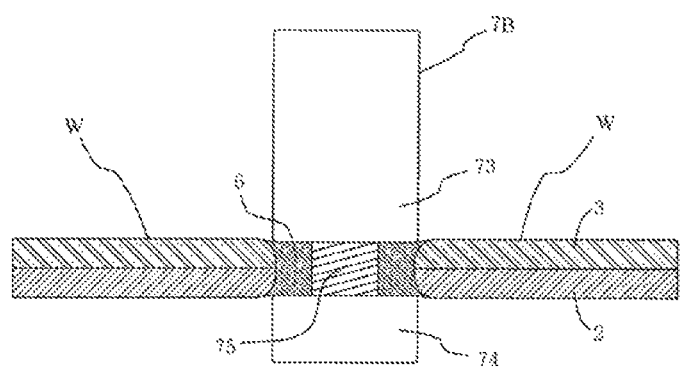
FIG. 11 shows a schematic view showing how friction stir welding is performed with a bobbin tool as another method of the fifth embodiment.

As shown in FIG. 11, as the friction stir welding tool, a pair of rotating members an upper rotating member 73 and a lower rotating member 74) that sandwich a work W where a plurality of members 2 and 3 are stacked and a bobbin tool 7B that includes a stir shaft 75 provided between the pair of rotating members 73 and 74 can be used. Although in the bobbin tool 7B shown in FIG. 10, a screw groove is formed in the stir shaft 75, astir shaft in which no screw groove is formed may be provided. The stir shaft 75 may be formed integrally with the lower rotating member 74 or the upper rotating member 75, or separately such that the direction of rotation of the upper rotating member 73 is reverse to the lower rotating member 74.

Sixth Embodiment

Figure 12A:
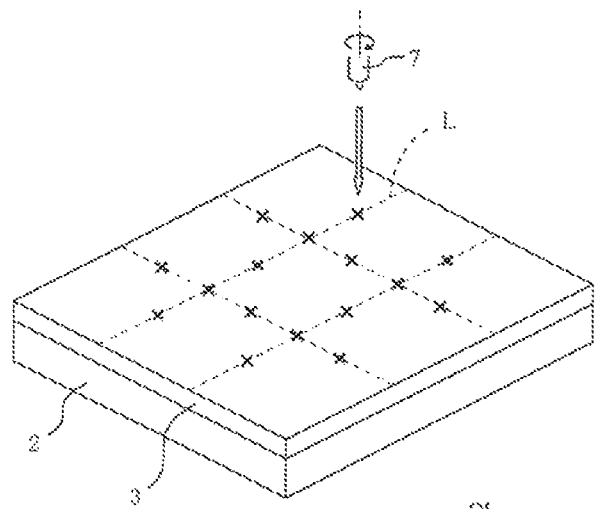
FIGS. 12A-12C show diagrams for illustrating friction stir spot welding as a method of a sixth embodiment of the present invention.
Figure 12B:
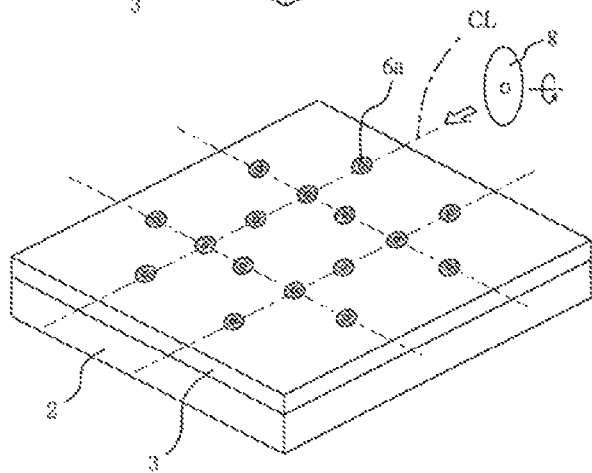
Figure 12C:
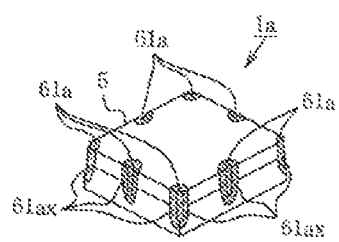

Referring to FIGS. 12A, 12B and 12C, there is shown a manufacturing method as a sixth embodiment according to the present invention. In this manufacturing method, various types of welding methods can be applied to the friction stir welding method in the welding step. That is, the welding method, without limitation to the method for relatively moving the friction stir welding tool to perform linear welding, may employ a method for performing spot welding without relatively moving the friction stir welding tool, a method for combining linear welding and spot welding or the like.

For example, in a welding process as shown in FIG. 12A, a plurality of members 2 and 3 stacked are friction stir spot welded by lowering, in positions (such as positions indicated by the symbols of "×" in FIG. 12A) a predetermined distance apart on a line L serving as the position of the edge portion of the structure, the friction stir welding tool 7 while rotating and bringing the friction stir welding tool 7 into contact therewith from the side of the surface of the lid plate to 3 on one side. In a cutting step as shown in FIG. 12B, cutting is performed with a cutting means such as the blade 8 along a predetermined cutting position CL including the friction stir spot welded portion 6a. As shown in FIG. 12C, a structure 1a in the case of the spot welding described above is formed to have junction portions 61a which are formed by the friction stir spot welding at a prescribed interval in the edge portions 5 on the outer circumference. Even in the case of the structure 1a by the spot welding, the width of each of the junction portions 61a is narrower than the shoulder diameter of the friction stir welding tool 7.

On the other hand, in the cross section of the edge portion 5 of the structure 1 (including the work W) when the cutting processing is performed after the friction stir welding, as shown in FIG. 1A, the cut surface 61x of the friction stir welded portion 61 and the other cut portion 5x affected by heat are exposed so as to extend parallel to the edge portion 5 of the structure 1 along the length direction. However, when the length of the probe of the tool 7 is substantially equal to the thickness of the work W, only the cut surface 61x of the friction stir welded portion 61 affected by heat is exposed.

Seventh Embodiment

Figure 13:
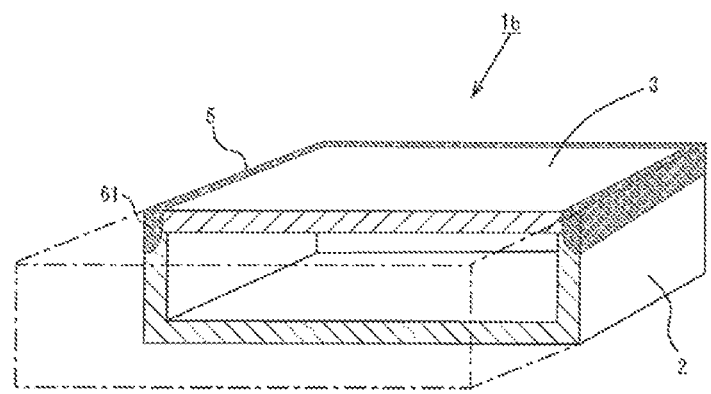
FIG. 13 is a cross-sectional perspective view showing a structure of a seventh embodiment of the present invention.

In FIG. 13, there is shown a cross-sectional view of a box-shaped structure 1b as a seventh embodiment according to the present invention. In the structure 1b, an opening part in the upper portion of a container 2 is covered with the lid plate 3, and the edge portions 5 on the four sides of the outer circumference are formed into the friction stir welded portions 61. As shown in FIG. 13, in this seventh embodiment, the structure 1b is formed with the container 3 (first member) whose upper portion is opened and the lid plate 3 (second member) which is stacked on the opening part of the container 2, and the junction portions 61 are provided by stacking the container 2 and the lid plate 3 and by being welded by a welding process by friction stir welding and a cutting process on the edge portions 5 along the upper end surfaces of the side walls of the container 2.

As a method for manufacturing the box-shaped structure 1b described above, as shown in FIGS. 14A and 14B, a plurality of works W in which the container 2 and the lid plate 3 are stacked are prepared, as described in the embodiment shown in FIG. 4 or 6, these works W are subjected to properly repeating the processes of the arrangement, the friction stir welding and the cutting steps and thus it is possible to manufacture a plurality of box-shaped structures 1b. As described above, the present invention can be applied to a member of a structure that is formed in the shape of a container surrounding the side walls of the outer circumference.

This embodiment may employ, lid plate group 3A where respective lid plates are formed integrally as shown in FIG. 5, whereby the arrangement process for at first arranging the respective lid plates 3 is simplified d labor saving for manufacturing process is performed.

Although in the seventh embodiment, the edge portions 5 on all the four sides of the structure 1b are friction stir welded and cut to form the junction portions 61, arbitrary sides such as only three sides may be welded or part of each side may be welded instead of the entire length of each side. If desired, friction stir spot welding may be partially employed.

Figure 15A:
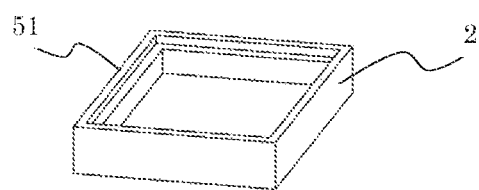
FIGS. 15A-15C show diagrams for illustrating another method of the seventh embodiment for manufacturing a box-shaped structure.
Figure 15B:
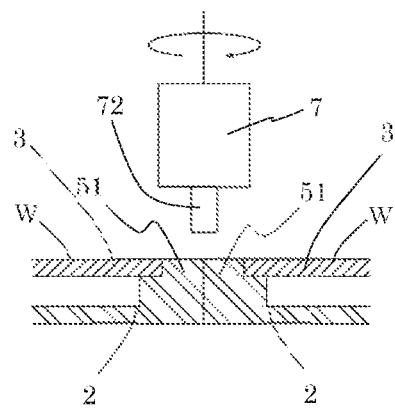
Figure 15C:
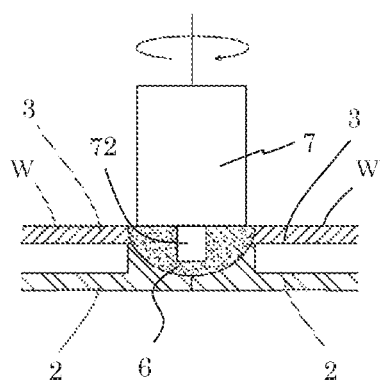

As shown in FIG. 15A, the containers 2 of this seventh embodiment may be respectively designed to include salient portions 51 on peripheral ends thereof so as to be fitted with lid plates 3. According to this construction, the respective lid plates 3 are fitted inside the salient portions 51, whereby its positioning against the containers 2 is facilitated. In these compositions, unwelded edge portions 5 of the containers 2 are arranged flatly to be placed in contact with each other to be flush, the superposition portion where the substrate 2 and the lid plate 3 are stacked is friction stir welded with a friction stir welding tool 7 provided with a shoulder having a diameter substantially equal to or larger than the widths of the pair of salient portions 51 of the containers 2 as shown in FIGS. 15B and 15C, whereby a plurality of box-shaped structures 1b shown in FIG. 13 are manufactured by properly combining processes for arrangement and cutting.

Eighth Embodiment

Figure 16A:
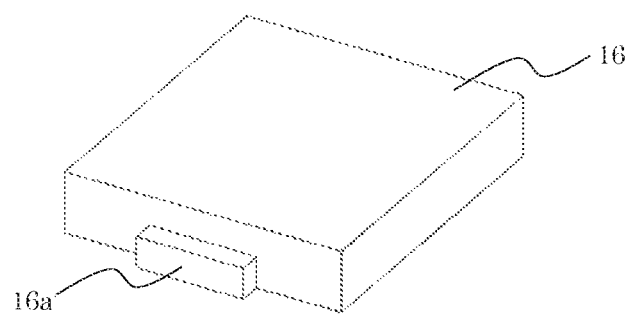
FIG. 16A is a perspective view of an electronic module.
Figure 16B:
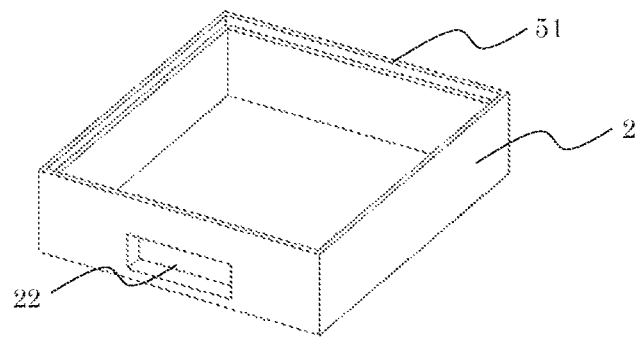
FIG. 16B is a perspective view of a container as an eighth embodiment of the present invention.

As shown in FIGS. 16A to 16F, the foregoing manufacturing method may be modified to produce an electronic device 20 as an eighth embodiment of the present invention. In FIG. 16A, an electronic module 16 is provided with an electronic connector 16a to be connected to an external unit not shown in any drawings. In FIG. 16B, a container 2 is provided with a hole portion 22 to be engaged with the connector 16a. The hole portion 22 is disposed at a bottom of the container apart from an edge portion 51 to avoid heat influence during friction stir welding in a welding step.

Figure 16C:
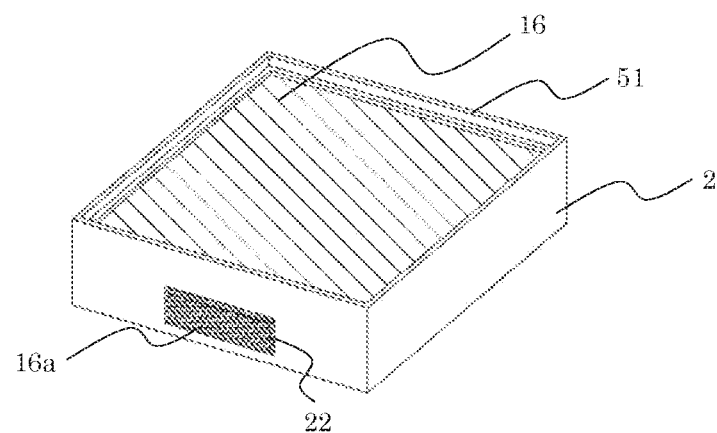
FIG. 16C is a perspective view of a structure in which the electronic module is stacked in the container.
Figure 16D:
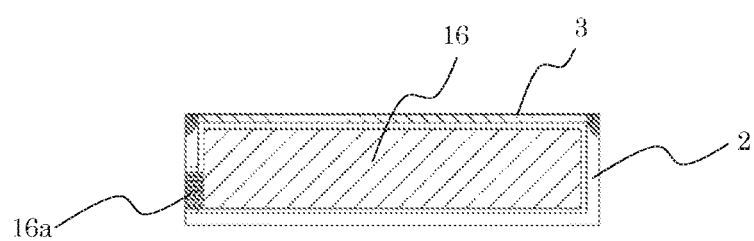
FIG. 16D is a cross-sectional view of an electronic device wherein the electronic module and a lid plate are stacked on the container as a finished product.

The electronic module 16 is inserted within the container 2 so as to expose the connector 16a through the hole portion 22 as shown in FIG. 16C. If desired, a spacer or an insulator may be additionally employed to secure position of the electronic module 16 within the container 2 before stacking the parts. Then, a lid plate 3 (like FIG. 14) is stacked on the container 2 by engagement with the edge portion 51, and friction sir welding is applied along the edge portion 51 to provide the finished electronic device 20 as shown in FIG. 16D by a similar manufacturing method of the arrangement step, the welding step and the cutting step as shown in FIG. 4. Thus, there are produced a plurality of isolated electronic devices 20 each including the container 2, the electronic module 16 and the lid plate 3. A cooler or a backing plate may be used to cool bottom walls of the containers 2 to reduce increase of temperature to the electronic modules 16 during the welding process.

The connector 16a connected with the housed electronic module 16 is exposed for connection with external unit without protruding from a side wall of the container 2 which may be allowed to contact with other side wall of its opposing container 2. The materials of the containers 2 and the lid plates 3 are made of metal in this eighth embodiment, but may be made of non-metal or resins which can wirelessly communicate signals between the electronic module 16 and its external units where the connector 16a may be deleted to provide a perfectly sealed electronic device. The electronic device 20 may be designed to provide other communication terminals or a liquid crystal display a frame of which is friction stir welded on a superposition portion e a pair members are stacked. The component of the electronic module may be designed to be a mechanical component or a chemical component to form a machine or chemical product.

Figure 16E:
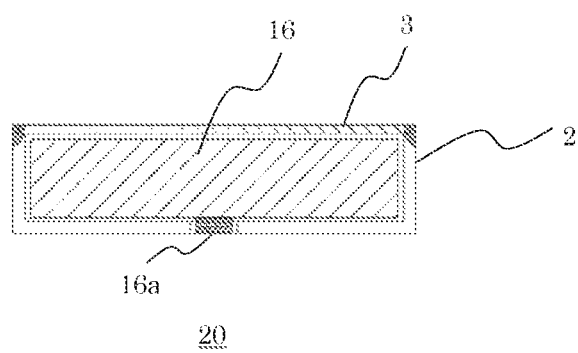
FIG. 16E is a cross-sectional view of an electronic device wherein the connector connected at the bottom surface of the electronic module.

Alternatively, the container 2 may be designed to have a hole portion 22 at the bottom surface of the container for an electronic connector (16a) disposed on bottom surface of the electronic module 16 shown in FIG. 16A. The electronic connector 16a) can be ensured to avoid heat influence during friction stir welding in the welding step in this construction. The electric module in this construction is shown in FIG. 16E.

Figure 16F:
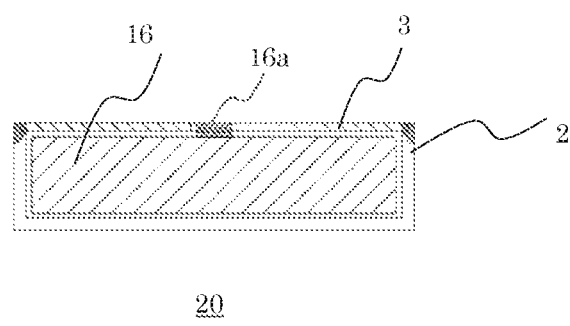
FIG. 16F is a cross-sectional view of an electronic device wherein the connector connected at the upper surface of the electronic module.

Alternatively, the lid plate 3 may be designed to have a hole portion for an electronic connector (16a) disposed on an upper surface of the electronic module 16 shown in FIG. 16A at a predetermined position thereof, wherein the hole portion 22 is not necessary to be disposed in the container 2 shown in FIG. 16B. The electric module in this construction is shown in FIG. 16F.

The present invention is not limited to the embodiments described above, and modifications are possible without departing from the spirit and scope of the present invention.

For example, in the manufacturing methods described in the foregoing embodiments above, in a state where the works in which a plurality of members are stacked are further stacked in layers, they can be used as materials to be manufactured, in this case, since the friction stir welding is performed between the upper and lower works, the junction portions on the edge portions are finally cut such that the upper and lower works are separated. The manufacturing pattern is not limited to the manufacturing pattern examples 1 and 2 described above (FIGS. 4 and 6), and may employ various types of patterns in which the arrangement step, the welding step and the cutting step are combined in various ways.

The present invention can be applied not only to the heat exchanger described above but also to various structures in which a part, parts or the whole of edge portions are welded in various devices, machines (the like such as a communication terminal device, a display device and a multilayer battery.

The invention claimed is:

1. A method for manufacturing a structure in which an edge portion of the structure formed by stacking a plurality of members is friction stir welded, the manufacturing method comprising:
a preparing step of preparing a predetermined number of works, each of the works having unwelded edge portions and having stacked layers of the members by stacking the members;
an arranging step of arranging the works flatly such that the unwelded edge portions of the works are placed in contact with each other to be flush;
a welding step of forming a friction stir welded portion by bringing a friction stir welding tool from a surface of one of the stacked members on one side into contact with a superposition portion of the works in which the members are stacked while rotating the friction stir welding tool; and
a cutting step of cutting the friction stir welded portion to divide the arranged works into the predetermined number of works,
whereby in each of the works obtained by the cutting, a junction portion of the edge portion of the structure is formed with the cut friction stir welded portion.

2. The method for manufacturing a structure according to claim 1, wherein the friction stir welded portion formed in the welding step is substantially equal to a shoulder diameter of the friction stir welding tool.

3. The method for manufacturing a structure according to claim 2,
wherein the edge portions on an entire perimeter of the structure are welded by repeatedly performing the arrangement step, the welding step and the cutting step.

4. The method for manufacturing a structure according to claim 1,
wherein, in the welding step, a width of a welding line is substantially equal to the shoulder diameter, and
wherein, in the cutting step, the friction stir welded portion is cut into halves along a direction of a length of the welding line.

5. The method for manufacturing a structure according to claim 1,
wherein the friction stir welding tool employs a probe-equipped tool having a probe on a shoulder at a tip end of the tool or a probe-free tool without the probe.

6. The method for manufacturing a structure according to claim 1,
wherein the friction stir welding tool employs a bobbin tool including a pair of rotating members sandwiching the work and a stir shaft provided between the pair of rotating members.

7. The method for manufacturing a structure according to claim 1,
wherein in a state where the works in which the members are stacked are further stacked in layers, the works are used as materials to be manufactured.

8. A method for manufacturing a plurality of works each having a container member, a lid member and a component member, the manufacturing method comprising:
a stacking step of stacking the component member within the container member and the lid member on the container member to form each of the works;
an arranging step of arranging the works flatly such that the unwelded edge portions of the works are placed in contact with each other to be flush;
a welding step of forming a friction stir welded portion by bringing a friction stir welding tool from a surface of the lid member into contact with a superposition portion where the lid member is stacked on container member while rotating the friction stir welding tool; and
a cutting step of cutting the friction stir welded portion to form individually cut works.

9. A method for manufacturing a plurality of works each having a first member and a second member, the manufacturing method comprising:
a preparing step of preparing a predetermined number of works having original sizes, each of the works having unwelded edge portions and having stacked layers that comprises the first member and the second member by stacking the same;
an arranging step of arranging the works flatly such that the unwelded edge portions of the works are placed in contact with each other to be flush;
a welding step of forming a friction stir welded portion by bringing a friction stir welding tool into contact with a superposition portion where the second member is stacked on the first member while rotating the friction stir welding tool; and
a cutting step of cutting the friction stir welded portion to form individually cut works,
whereby the cut works obtained by the cutting are respectively provided with the original sizes in the preparing step.

10. The method for manufacturing a plurality of works according to claim 9,
wherein in the welding step, the friction stir welding tool is brought from a surface of the second member into contact with the superposition portion, and
wherein in each of the works obtained by the cutting, a junction portion of the edge portion of the cut work is formed with the cut friction stir welded portion.

11. The method for manufacturing a plurality of works according to claim 10,
wherein in the welding step, the friction stir welding tool is brought from the surface of the second member into contact with the superposition portion for a relative movement.

12. The method for manufacturing a plurality of works according to claim 10,
wherein in the welding step, the friction stir welding tool is brought by lowering from the surface of the second member into contact with the superposition portion.

13. The method for manufacturing a plurality of works according to claim 9,
wherein the first member is a substrate or container member and the second member is a lid member.

* * * * *